(12) United States Patent
Kaida

(10) Patent No.: US 6,229,246 B1
(45) Date of Patent: May 8, 2001

(54) THICKNESS-EXTENSIONAL PIEZOELECTRIC RESONATOR AND PIEZOELECTRIC RESONANCE COMPONENT INCORPORATING SAME

(75) Inventor: Hiroaki Kaida, Moriyama (JP)

(73) Assignee: Murata Manufacturing Co., Ltd. (JP)

( * ) Notice: Subject to any disclaimer, the term of this patent is extended or adjusted under 35 U.S.C. 154(b) by 0 days.

(21) Appl. No.: 09/458,469

(22) Filed: Dec. 9, 1999

(30) Foreign Application Priority Data

Dec. 18, 1998 (JP) .................................................. 10-360911

(51) Int. Cl.[7] .................................................. H01L 41/08
(52) U.S. Cl. .................................................. 310/320; 310/366
(58) Field of Search .................................. 310/320, 365, 310/366, 358, 359, 367, 368

(56) References Cited

U.S. PATENT DOCUMENTS

| | | | |
|---|---|---|---|
| 4,939,403 | * 7/1990 | Kittaka et al. | 310/320 |
| 5,045,791 | * 9/1991 | Ando et al. | 310/320 |
| 5,057,801 | * 10/1991 | Kittaka et al. | 310/320 |
| 5,065,066 | * 11/1991 | Nakatani et al. | 310/320 |
| 5,084,647 | * 1/1992 | Inoue et al. | 310/320 |
| 6,040,652 | * 3/2000 | Kaida | 310/320 |
| 6,051,910 | * 4/2000 | Kaida et al. | 310/320 |
| 6,051,916 | * 4/2000 | Kaida et al. | 310/320 |
| 6,107,727 | * 8/2000 | Kaida et al. | 310/320 |

FOREIGN PATENT DOCUMENTS

| | | |
|---|---|---|
| 1-117409 | 5/1989 | (JP) . |
| 2-235422 | 9/1990 | (JP) . |

\* cited by examiner

*Primary Examiner*—Mark O. Budd
(74) *Attorney, Agent, or Firm*—Keating & Bennett, LLP

(57) ABSTRACT

A thickness-extensional piezoelectric resonator using a harmonic of a thickness-extensional vibration mode has a compact size, large electric capacity, and small variations in resonance characteristics, and is not affected by the stray capacitance of a circuit board. The thickness-extensional piezoelectric resonator includes a substantially rectangular-plate piezoelectric body, a first excitation electrode and a second excitation electrode disposed on individual surfaces of the piezoelectric body, and an internal electrode inside of the piezoelectric body. Portions where the first excitation electrode, the second excitation electrode and the internal electrode overlap define a resonating portion. In the length direction of the piezoelectric body, a vibration-attenuating portion is defined at each side of the resonating portion, whereas in the width direction, the vibration-attenuating portion is not provided at each side thereof. In addition, a relationship $|Dr-Di|=Di/10$ is satisfied, where Dr is the thickness of piezoelectric layers between the excitation electrodes and the internal electrode, Di is substantially equal to T/N, where T is the thickness of the piezoelectric body and N is the order of harmonics of the width extensional vibration mode.

20 Claims, 9 Drawing Sheets

US 6,229,246 B1

THICKNESS-EXTENSIONAL PIEZOELECTRIC RESONATOR AND PIEZOELECTRIC RESONANCE COMPONENT INCORPORATING SAME

BACKGROUND OF THE INVENTION

1. Field of the Invention

The present invention relates to piezoelectric resonators used as various kinds of resonators and oscillators, and piezoelectric resonance components incorporating such resonators. More specifically, the present invention relates to thickness-extensional piezoelectric resonators utilizing harmonics of a thickness-extensional vibration mode and piezoelectric resonance components incorporating such resonators.

2. Description of the Related Art

Piezoelectric resonators have been used in piezoelectric resonance components such as a piezoelectric oscillator and a piezoelectric filter. It is known that such conventional piezoelectric resonators use different piezoelectric resonance modes according to frequencies used.

In Japanese Unexamined Patent Publication No. 1-117409, an energy-trap type piezoelectric resonator utilizing the second-order harmonic of the thickness-extensional vibration mode is disclosed. This piezoelectric resonator will be described below referring to FIGS. 9 and 10.

FIG. 9 is an exploded perspective view of the piezoelectric resonator. In FIG. 9, the piezoelectric resonator is produced by integrally firing two laminated piezoelectric ceramic green sheets 51 and 52. A round excitation electrode 53 is provided at the center of the ceramic green sheet 51 and is led out to an edge of the ceramic green sheet 51 via a leading electrode 54. In addition, a round excitation electrode 55 is provided at the center of the upper surface of the ceramic green sheet 52 and is led out to an edge of the ceramic green sheet 52 via a leading electrode 56. An excitation electrode 57 is provided on the lower surface of the ceramic green sheet 52 and is led out to an edge of the ceramic green sheet 52 via a leading electrode 58. This is indicated by a reflection of the configuration below the ceramic green sheet 52.

Pressure is applied to the laminated ceramic green sheets 51 and 52 in the thickness direction of the laminated structure so as to obtain a fired body. Subsequently, polarization processing is performed on the fired body so as to produce a piezoelectric resonator 60 shown in FIG. 10.

In the piezoelectric resonator 60, polarization processing is performed on piezoelectric layers 61 and 62 in a direction indicated by arrows shown in FIG. 10. That is, polarization processing is performed on the fired body uniformly in the thickness direction of the structure.

In the case of driving, the excitation electrodes 53 and 57 are commonly connected and an AC voltage is applied between the excitation electrodes 53, 57, and 55 so as to vibrate the piezoelectric resonator 60. Excitation energy is trapped in a region where the excitation electrodes 53, 55, and 57 overlap, that is, in a resonating portion A.

As described above, the piezoelectric resonator 60 using a harmonic of the thickness-extensional vibration mode defines an energy-trapping-type piezoelectric resonator. Thus, it is necessary to dispose a vibration-attenuating portion for attenuating vibration at an area surrounding the resonating portion A. In other words, a vibration-attenuating portion that is larger than the area of the resonating portion needs to be provided. As a result, it is very difficult to reduce the size of the conventional piezoelectric resonator 60.

Japanese Unexamined Patent Publication No. 2-235422 discloses another energy-trap type piezoelectric resonator using a strip-type piezoelectric ceramic body. In the piezoelectric resonator, it is not essential to provide an extra piezoelectric-substrate portion around the resonating portion. As shown in FIG. 11, an excitation electrode 72a is provided on the upper surface of a narrow piezoelectric substrate 71, and an excitation electrode 72b is provided on the lower surface thereof. The excitation electrodes 72a and 72b are formed such that their widths are equal to the width of the piezoelectric substrate. The excitation electrodes 72a and 72b oppose each other at the center in the length direction of the piezoelectric substrate 71 to define a resonating portion. In addition, the excitation electrodes 72a and 72b are arranged to extend to opposite edges 71a and 71b in the length direction of the piezoelectric substrate 71.

In a piezoelectric resonator 70 shown in FIG. 11, in the case of excitation of the thickness-extensional vibration mode, unnecessary vibrations occur due to the dimensional relationship between the width W and the thickness T of the piezoelectric substrate 71. Regarding this problem, in Japanese Unexamined Patent Publication No. 2-235422, it is shown that, in order to reduce unnecessary spurious vibrations between a resonant frequency and an anti-resonant frequency while a fundamental wave is used, the value of W/T must be substantially equal to 5.33 in the 16 MHz resonant frequency. In the event the third-order harmonic is used, the value of W/T must be substantially equal to 2.87 in the 16 MHz resonant frequency.

In the energy-trap type piezoelectric resonator disclosed in Japanese Unexamined Patent Publication No. 2-235422, since it is not necessary to provide a vibration-attenuating portion around the resonating portion, the size of the piezoelectric resonator can be reduced. However, when the harmonic of the thickness-extensional vibration mode is actually used, in addition to spurious vibrations generated between a resonant frequency band and an anti-resonant frequency band, various undesirable spurious vibrations occur, with the result that effective resonance characteristics cannot be obtained. Furthermore, the electric capacity of this piezoelectric resonator is relatively small, the resonator is thereby susceptible to influence from the stray capacitance of a circuit board.

SUMMARY OF THE INVENTION

To overcome the above described problems, preferred embodiments of the present invention provide a thickness-extensional piezoelectric resonator adapted to be vibrated in a harmonic of the thickness-extensional vibration mode and a piezoelectric resonance component incorporating such a resonator, which achieve significant reduction in size, have large electric capacity so as to not be susceptible to influence from the stray capacitance of a circuit board, and have small variations in resonance characteristics.

One preferred embodiment of the present invention provides a thickness-extensional piezoelectric resonator including a resonating portion, a vibration-attenuating portion disposed at each side of the resonating portion and adapted to be vibrated in an N-order harmonic of a thickness-extensional vibration mode, a substantially rectangular-plate piezoelectric body; a first excitation electrode and a second excitation electrode disposed on individual surfaces of the substantially rectangular-plate piezoelectric body in such a way that the electrodes oppose each other with the piezoelectric body therebetween; at least one internal electrode disposed inside of the piezoelectric body and arranged such that the at least one internal electrode at least partially opposes both the first excitation electrode and the second excitation electrode with the piezoelectric body therebetween, the resonating portion being defined by a portion where the first excitation electrode, the second excitation electrode, and the at least one internal electrode overlap in the thickness direction of the piezoelectric body; when a direction connecting the vibration-attenuating portions at both sides of the resonating portion is a first direction, the first excitation electrode and the second excitation electrode being arranged such that the electrodes extend close to or to the edges of the piezoelectric body, in a direction that is substantially perpendicular to the first direction; and a relationship of $|Dr-Di|=Di/10$ is satisfied, wherein Dr indicates the thickness of the piezoelectric layers between the excitation electrodes and the internal electrode or the thickness of a piezoelectric layer between a plurality of internal electrodes, the value of Di is substantially equal to T/N, wherein T is the thickness of the piezoelectric body and N is the order of harmonics of the thickness-extensional vibration mode.

Another preferred embodiment of the present invention provides a piezoelectric resonance component including a substrate and a case member which define a case, and the above described thickness-extensional piezoelectric resonator, which is mounted on the substrate such that an empty space is provide to allow for free and unhindered vibration of the resonator. The case member is fixed to the substrate to enclose the thickness-extensional piezoelectric resonator mounted on the substrate. A capacitor substrate (not shown) is preferably used as the substrate. In other words, the thickness-extensional piezoelectric resonator is fixed to a capacitor substrate having a dielectric substrate and a plurality of electrodes provided thereon. With such arrangement, the thickness-extensional piezoelectric resonator is electrically connected to capacitors provided on the capacitor substrate.

The above and further features, aspects, and advantages of the present invention will be more fully apparent from the following detailed description of preferred embodiments with reference to the accompanying drawings.

DETAILED DESCRIPTION OF PREFERRED EMBODIMENTS

A detailed explanation of the present invention will be provided below referring to some of the preferred, non-restrictive embodiments of the present invention.

Figure 1A:
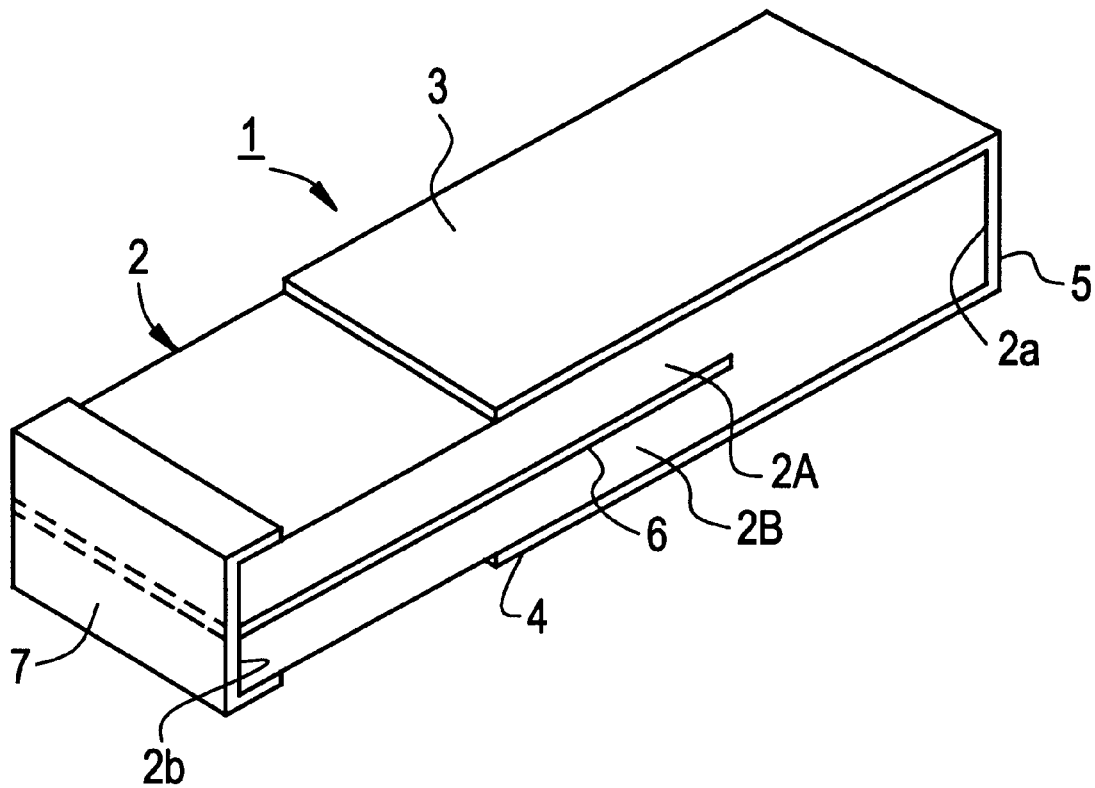
FIG. 1A a perspective view of a thickness-extensional piezoelectric resonator according to a first preferred embodiment of the present invention.
Figure 1B:
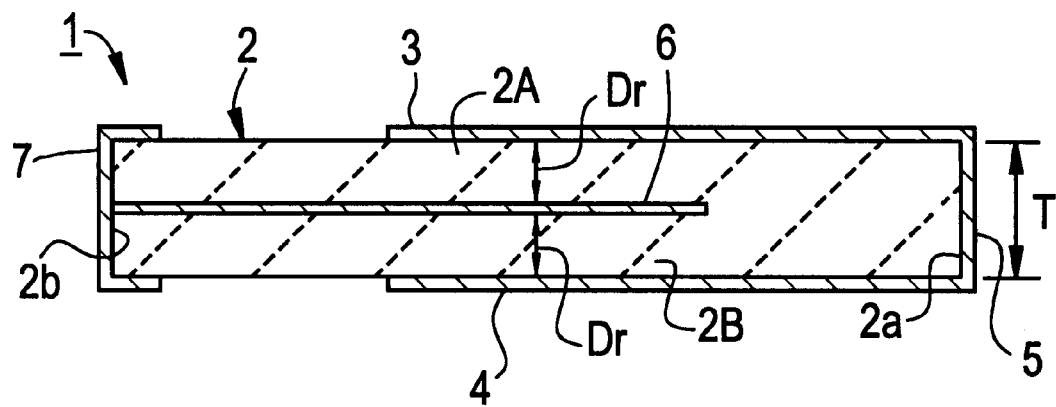
FIG. 1B is a vertical section view of the thickness-extensional piezoelectric resonator of FIG. 1A.

FIGS. 1A and 1B show a perspective view and a vertical sectional view according to a first preferred embodiment of the invention.

A thickness-extensional piezoelectric resonator of the first preferred embodiment is preferably constructed using a narrow strip piezoelectric body 2, which is preferably made of a piezoelectric ceramic such as lead titanate. Polarization processing is performed on the piezoelectric body 2 equally in the thickness direction thereof.

A first excitation electrode 3 is provided on the upper surface of the piezoelectric body 2, and a second excitation electrode 4 is provided on the lower surface thereof. The excitation electrodes 3 and 4 extend from one end surface 2a of the piezoelectric body 2 to the other end surface 2b thereof on the upper surface and lower surface thereof. The excitation electrodes 3 and 4 are commonly connected by a connecting electrode 5 disposed on the end surface 2a of the piezoelectric body 2.

An internal electrode 6 is preferably provided at the approximate middle position of the height of the piezoelectric body 2. The internal electrode 6 is led out to the end surface 2b of the piezoelectric body 2 and is electrically connected to a terminal electrode 7 provided on the end surface 2b.

When driven, an AC voltage is applied between the first excitation electrode 3 and the internal electrode 6, and the second excitation electrode 4 and the internal electrode 6, respectively, whereby the second-order harmonic of the thickness-extensional vibration mode is strongly excited so as to actuate the piezoelectric resonator utilizing the second-order harmonic of the thickness-extensional vibration mode.

In this preferred embodiment, the first excitation electrode 3, the second excitation electrode 4, and the internal electrode 6 overlap with the piezoelectric layer therebetween in the length direction of the piezoelectric body 2. As a result, at the region where the first excitation electrode 3, the second excitation electrode 4, and the internal electrode 6 overlap, an energy-trap type resonating portion is defined. Portions of the piezoelectric body between the resonating portion and the end surfaces 2a and 2b attenuate energy generated when the resonating portion is excited.

If the resonating portion is considered to be defined at the approximate center portion, a vibration-attenuating portion is disposed at each side of the piezoelectric body 2 only in the length direction thereof, and the first excitation electrode and the second excitation electrode are arranged such that they extend to the edges of the piezoelectric substrate in the width direction perpendicular to the length direction, that is, the edges thereof extending in the longitudinal direction.

In this situation, it is preferable for the first excitation electrode 3, the second excitation electrode 4, and the internal electrode 6 to be arranged such that they have substantially the same widths as the entire width of the piezoelectric body 2 only at the resonating portion. However, the electrodes do not necessarily need to be formed in such a configuration outside of the resonating portion. For example, the excitation electrode 3 is preferably arranged such that excitation electrode is as wide as the entire width of the piezoelectric body 2 only at the resonating portion. In contrast, the portion between the resonating portion of the excitation electrode 3 and the end surface 2a can have a narrower width, since this portion is simply a part where the excitation electrode is electrically connected to the connecting electrode 5.

In the thickness-extensional piezoelectric resonator 1 of the first preferred embodiment, the vibration-attenuating portion is disposed at each side of the vibrating part only in the length direction of the piezoelectric body 2, whereas the vibration-attenuating is not disposed in the width direction thereof. Accordingly, in the thickness-extensional piezoelectric resonator 1, the width of the piezoelectric body can be reduced so as to produce a compact piezoelectric resonator.

In addition, since the piezoelectric resonator used in the first preferred embodiment has a structure in which the excitation electrodes 3, 4, and the internal electrode 6 are laminated via the piezoelectric layers, the resonator has a much larger electric capacity than the conventional thickness-extensional piezoelectric resonator 70 having no internal electrodes, with the result that the piezoelectric resonator 1 is much less susceptible to influence of any stray capacitance of a circuit board. At the same time, forming the first and second excitation electrodes 3 and 4 such that they reach the edges of the piezoelectric body 2 in the width direction thereof, thereby increasing the electric capacity, further reduces the influence of stray capacitance.

Figure 2:
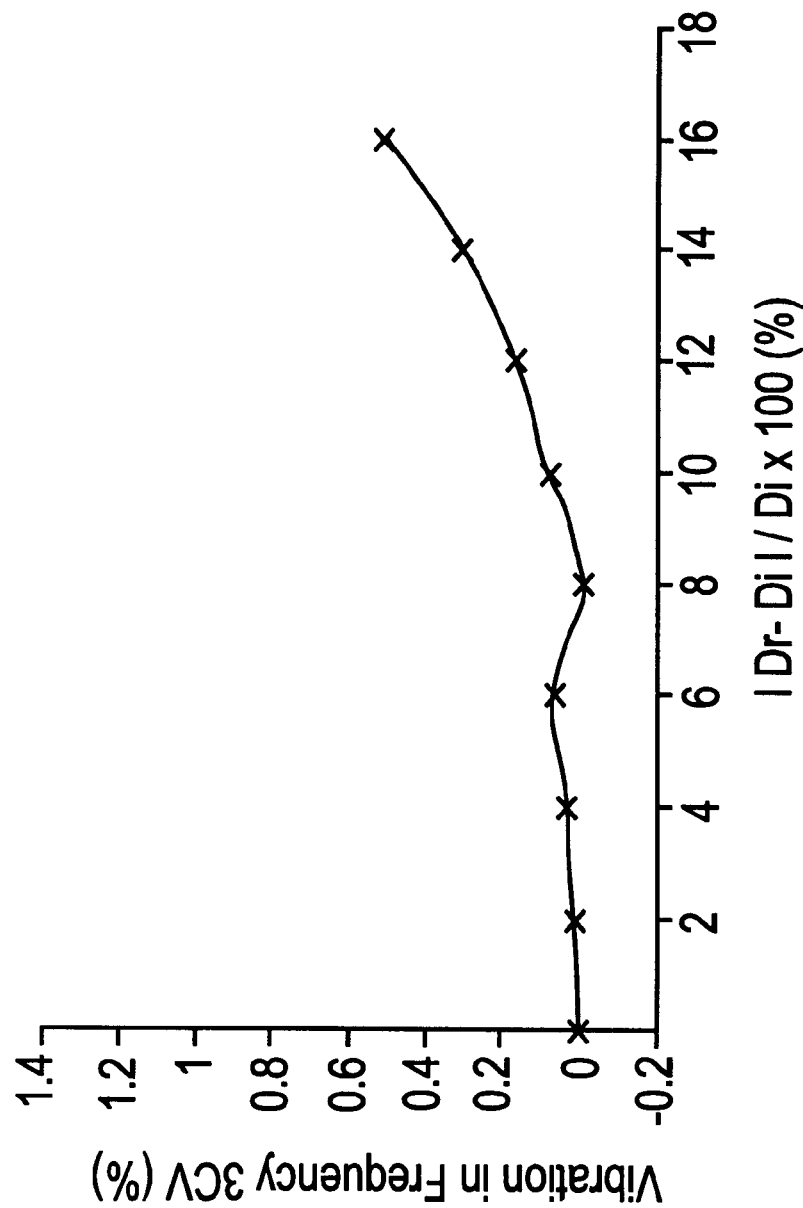
FIG. 2 is a graph showing the relationship between the values of $|Dr-Di|/Di \times 100$ (%) and variations 3CV in a resonant frequency.

According to the thickness-extensional piezoelectric resonator 1 of the first preferred embodiment, when the thickness of the piezoelectric layers 2A and 2B is represented by the symbols Dr1 and Dr2, respectively, the entire thickness of the piezoelectric body 2 is represented by the symbol T, and the symbol Di is set to be substantially equal to T/N, equations $|Dr1-Di|=Di/10$ and $|Dr2-Di|=Di/10$ are satisfied. This arrangement allows variations in the resonance characteristics of the piezoelectric resonator to be greatly reduced. FIG. 2 illustrates the situation described above.

In the thickness-extensional piezoelectric resonator 1, in order to obtain satisfactory resonance characteristics, it is preferable for the piezoelectric layers 2A and 2B on the upper and lower sides of the internal electrode 6 to have substantially equal thicknesses. However, when the thickness-extensional piezoelectric resonator 1 is produced, variations may exist in the thickness between the piezoelectric layers 2A and 2B occur. This is due to variations in the thickness between the piezoelectric green sheets used for forming the piezoelectric body 2, variations generated in the process for firing the piezoelectric body 2, or the like.

However, according to preferred embodiments of the present invention, even if the position of the thickness direction of the internal electrode 6 deviates from the desired position, there are almost no deviations in the resonant frequency and the anti-resonant frequency. One of the many advantages of the present invention is based on the empirical discovery that when the equation $|Dr-Di|=Di/10$ is satisfied, variations in the resonance characteristics of the piezoelectric resonator of the preferred embodiment are greatly reduced.

In examples of this preferred embodiment, the piezoelectric body 2, which is about 2.0 mm long, about 0.4 mm wide, and about 0.3 mm high, was used to produce various thickness-extensional piezoelectric resonators and to measure the values of $|Dr-Di|/Di$ obtained in the produced thickness-extensional piezoelectric resonators. In other words, measurement was conducted to determine how much the position of the internal electrode 6 deviates from its correct position in the thickness direction. Resonance frequencies in those thickness-extensional piezoelectric resonators were then measured, the result of which are shown in FIG. 2. The vertical axis of FIG. 2 indicates variations 3CV in the resonance frequencies of the 100 piezoelectric resonators produced under each condition, and the horizontal axis thereof shows the values of $|Dr-Di|/Di \times 100$ (%). As evident from FIG. 2, when the value of $|Dr-Di|/Di \times 100$ (%) is within 10%, the variation rate of resonance frequencies is extremely small, which is less than or equal to about 0.1%.

In the thickness-extensional piezoelectric resonator I in accordance with the first preferred embodiment, polarization processing is uniformly performed on the piezoelectric body 2 in the thickness direction. In this case, the piezoelectric resonator is a parallel connection type in which an electric field applied to each of the piezoelectric layers is reversed. However, in this invention, it is also possible to use a series connection type piezoelectric resonator in which polarization processing is performed on a plurality of piezoelectric layers alternately in a direction opposite to the thickness direction.

Figure 3:
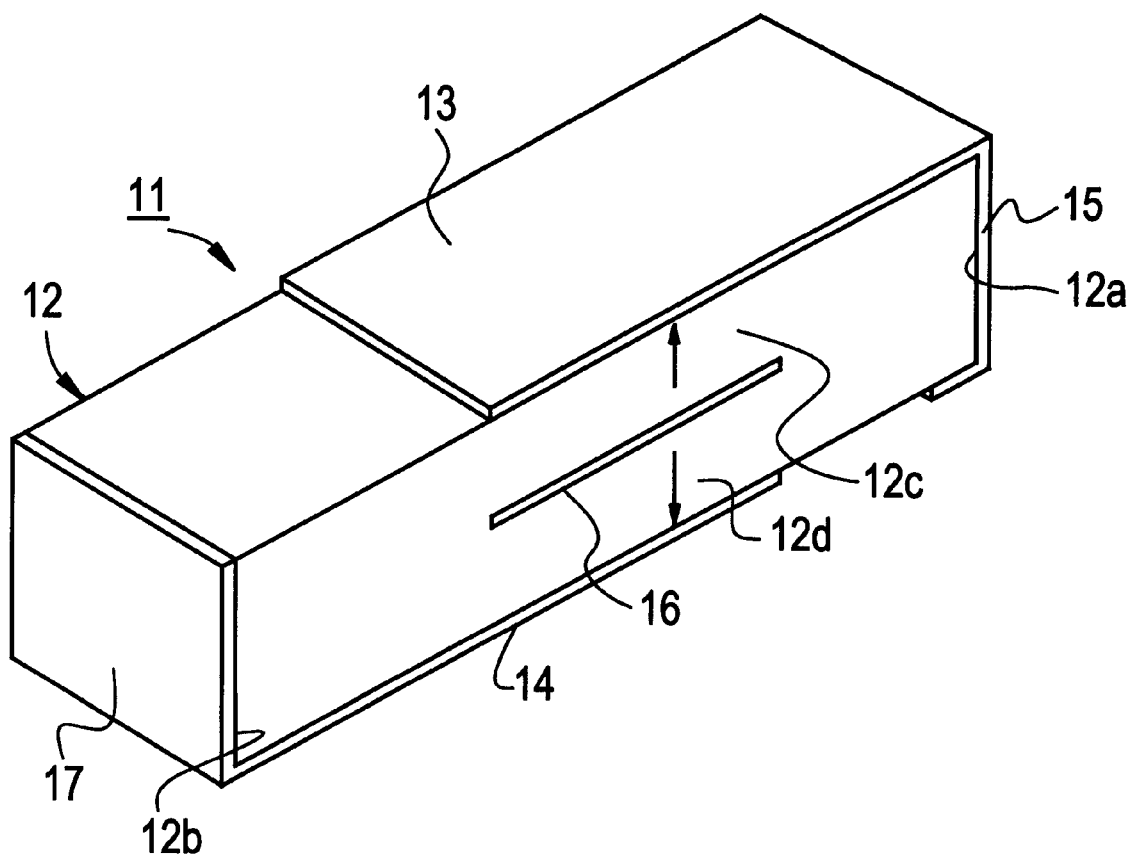
FIG. 3 is a perspective view of a thickness-extensional piezoelectric resonator according to a second preferred embodiment of the invention.

FIG. 3 shows a second preferred embodiment of thickness-extensional piezoelectric resonator with such a series connection. The thickness-extensional piezoelectric resonator 11 shown in FIG. 3 includes a strip-type piezoelectric body 12, which has a configuration of a substantially rectangular plate. A first excitation electrode 13 is provided on the upper surface of the piezoelectric body 12 a second excitation electrode 14 is provided and on the lower surface thereof. The first excitation electrode 13 and the second excitation electrode 14 oppose each other with the piezoelectric body 12 disposed therebetween. In addition, the first excitation electrode 13 and the second excitation electrode 14 are disposed opposite to each other at the approximate central region in the length direction of the piezoelectric body 12. The region where the excitation electrodes 13 and 14 oppose each other is used as an energy-trapping resonating portion.

In this second preferred embodiment, the first excitation electrode 13 and the second excitation electrode 14 are preferably extended to an end surface 12a and an end surface 12b of the piezoelectric body 12, respectively. However, no parts of the electrodes except the resonating portion have to be formed such that they are as wide as the entire width of the piezoelectric body 12. Also shown in FIG. 3, at the approximate middle position of the height of the piezoelectric body 12, an internal electrode 16 is arranged to perform polarization processing on the piezoelectric body 12. When polarization processing is performed, a relatively high voltage is applied to the internal electrode 16, whereas a relatively low voltage is applied to the excitation electrodes 13 and 14, with the result that the piezoelectric layers 12c and 12d are polarized relative to reverse in the thickness direction, as indicated by arrows in FIG. 3. In addition, the piezoelectric layers 12c and 12d are arranged in such a manner that the layers satisfy the equation of |Dr−Di|Di/10.

When driven, an AC voltage is applied between the first excitation electrode 13 and the second excitation electrode 14, whereas the internal electrode 16 is not used. This allows the second-order harmonic TE2 of the thickness-extensional vibration mode to be excited. Furthermore, no vibration-attenuating portions are provided on both sides of the vibrating portion in the width direction of the piezoelectric body 2. Rather, the vibration-attenuating portions are disposed only on both sides of the vibrating portion in the length direction of the piezoelectric body 12. Thus, as in the piezoelectric resonator of the first preferred embodiment, a compact thickness-extensional piezoelectric resonator is provided. Furthermore, as in the first preferred embodiment, since the second preferred embodiment has the internal electrode 16, and the excitation electrodes 13 and 14 used in the second preferred embodiment are also arranged to extend to both edges of the width direction of the piezoelectric body 12, an electric capacity is greatly increased, resulting in much less vulnerability due to the stray capacitance of the circuit board.

Similar to the case of the first preferred embodiment, since the equation of |Dr−Di|=Di/10 is satisfied in the thickness-extensional piezoelectric resonator 11 of the second preferred embodiment, variations in the resonance characteristics of the piezoelectric resonator effectively reduced.

Figure 4:
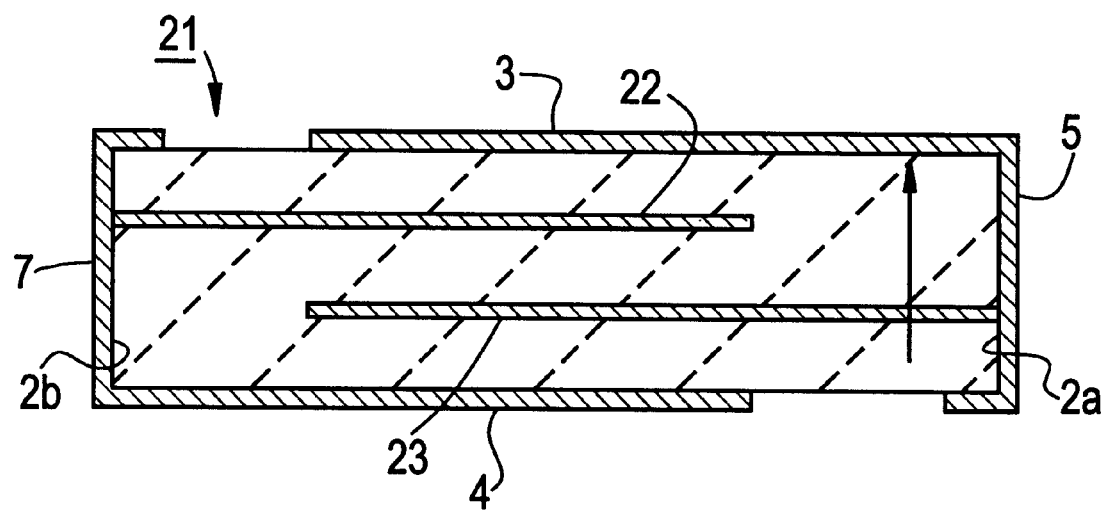
FIG. 4 is a vertical sectional view showing a modification of the thickness-extensional piezoelectric resonator in accordance with preferred embodiments of the present invention.

Both the first and second preferred embodiments use the second harmonic of thickness-extensional vibration mode. However, it is also possible to adopt a piezoelectric resonator that utilizes harmonics other than the second harmonic of the thickness-extensional vibration mode. FIGS. 4 to 6 show sectional views for illustrating piezoelectric resonators utilizing other harmonics.

FIG. 4 shows a parallel-connection-type thickness-extensional piezoelectric resonator 21 utilizing the third-order harmonic of the thickness-extensional vibration mode. Inside the piezoelectric body 2, two internal electrodes 22 and 23 are provided, and polarization processing is performed on the piezoelectric body 2 uniformly in the thickness direction thereof, as indicated by an arrow.

Figure 5A:
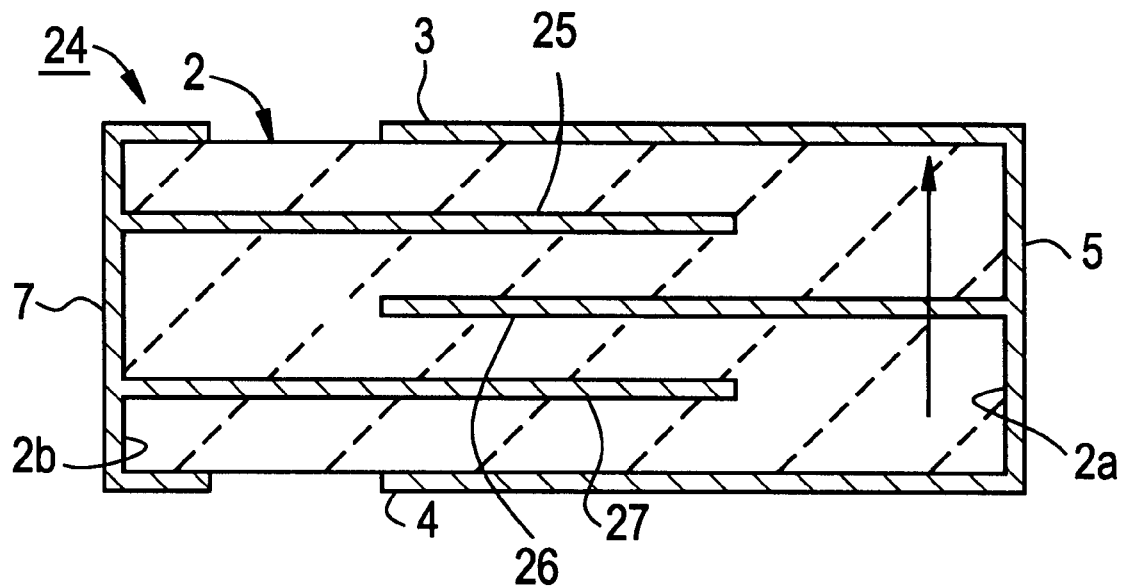
FIGS. 5A and 5B are vertical sectional views of other modifications of the thickness-extensional piezoelectric resonator in accordance with preferred embodiments of the present invention.
Figure 6:
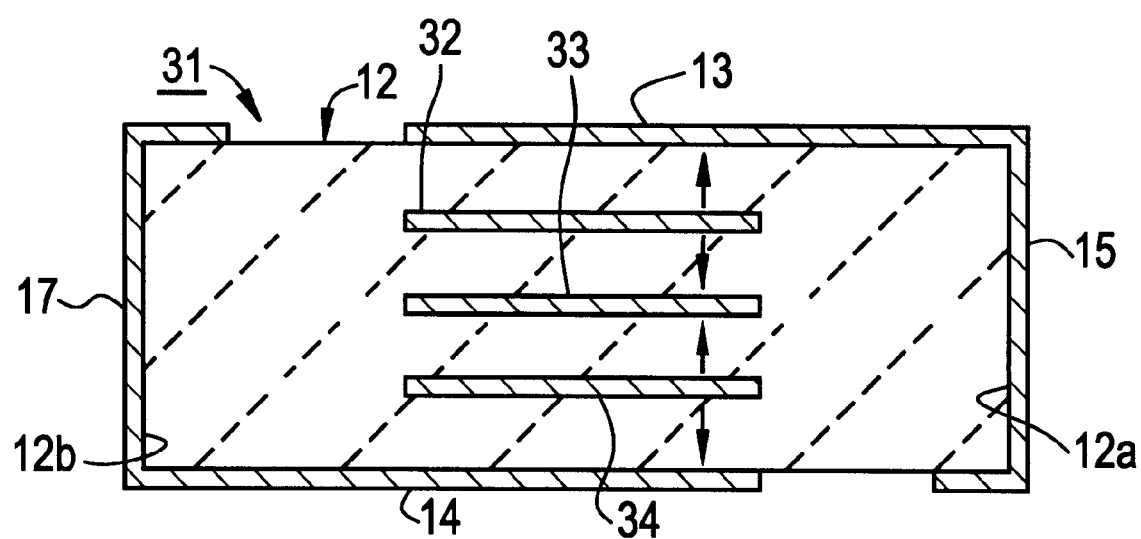
FIG. 6 is a vertical sectional view showing another modification of the thickness-extensional piezoelectric resonator in accordance with preferred embodiments of the present invention.

FIG. 5A shows a sectional view of a parallel-connection-type thickness-extensional piezoelectric resonator 24, which utilizes the fourth-order harmonic of the thickness-extensional vibration mode. In the thickness-extensional piezoelectric resonator 24, polarization processing is performed on the piezoelectric body 2 uniformly in the thickness direction. Inside the piezoelectric body 2 are arranged three internal electrodes 25 to 27 at equal distances therebetween in the thickness direction, whereby the fourth-order harmonic of the thickness-extensional vibration mode is effectively excited.

Figure 5B:
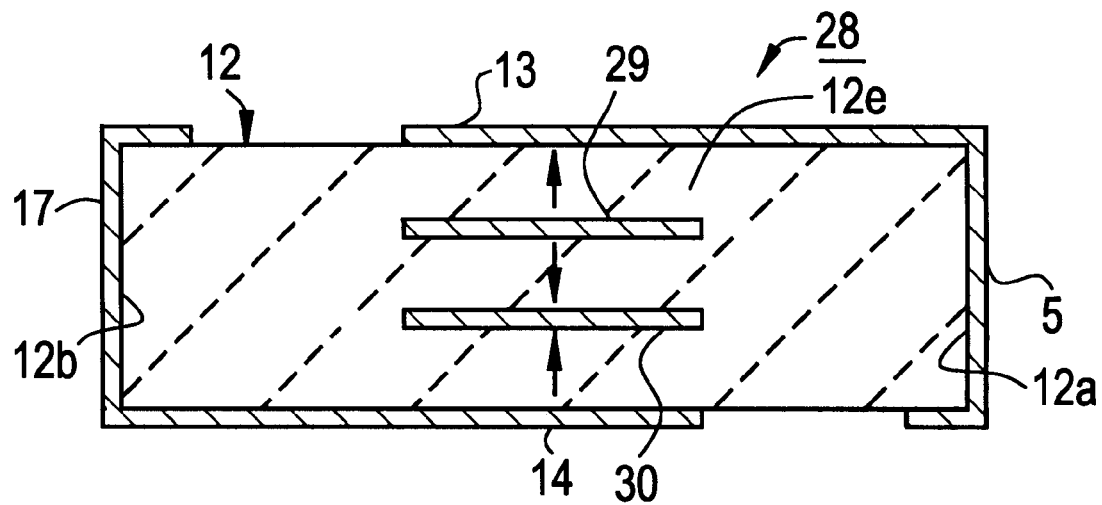

FIG. 5B is a sectional view illustrating a series-connection-type thickness-extensional piezoelectric resonator 28 utilizing the third-order harmonic of the thickness-extensional vibration mode. Inside of the piezoelectric body 12 are disposed two internal electrodes 29 and 30, whereby the interior of the piezoelectric body 12 is divided into three piezoelectric layers 12e to 12g. Performing polarization processing by using the internal electrodes 29 and 30 allows the adjacent piezoelectric layers to be polarized in reverse relative to the thickness direction. As a result, an AC voltage is applied to the first excitation electrode 13 and the second excitation electrode 14 so that the third-order harmonic of the thickness-extensional vibration mode is excited.

FIG. 6 is a sectional view of a series-connection-type thickness-extensional piezoelectric resonator 31 using the fourth-order harmonic of the thickness-extensional vibration mode. In the thickness-extensional piezoelectric resonator 31, three internal electrodes 32 to 34 are disposed inside of the piezoelectric body 12. Polarization processing using the internal electrodes 32 to 34 allows the adjacent piezoelectric layers to be polarized in the thickness direction in such a manner that the adjacent piezoelectric layers are polarized oppositely relative to each other, as shown in FIG. 6. Under this situation, an AC voltage is applied from the first excitation electrode 13 and the second excitation electrode 14 to allow the piezoelectric resonator 31 to operate as a piezoelectric resonator utilizing the fourth-order harmonic of the thickness-extensional vibration mode.

In each of the thickness-extensional piezoelectric resonators shown in FIGS. 4 to 6, as described above, the vibration-attenuating portions are disposed only in one direction, and the first and second excitation electrodes are arranged such that the electrodes extend to the edges of the piezoelectric body or close thereto. Such an arrangement allows the thickness-extensional piezoelectric resonator to be compact in size. In addition, since each of the modifications including at least one internal electrode, a large increase in the electric capacity is achieved, so that there is very little susceptibility to the influence of the stray capacitance of a circuit board.

In each thickness-extensional piezoelectric resonator shown in FIGS. 4 to 6, if the equation |Dr−Di|=Di/10 is satisfied, as in the case of the thickness-extensional piezoelectric resonator of the first preferred embodiment, variations in the resonance characteristics of each modification are effectively reduced.

Figure 7:
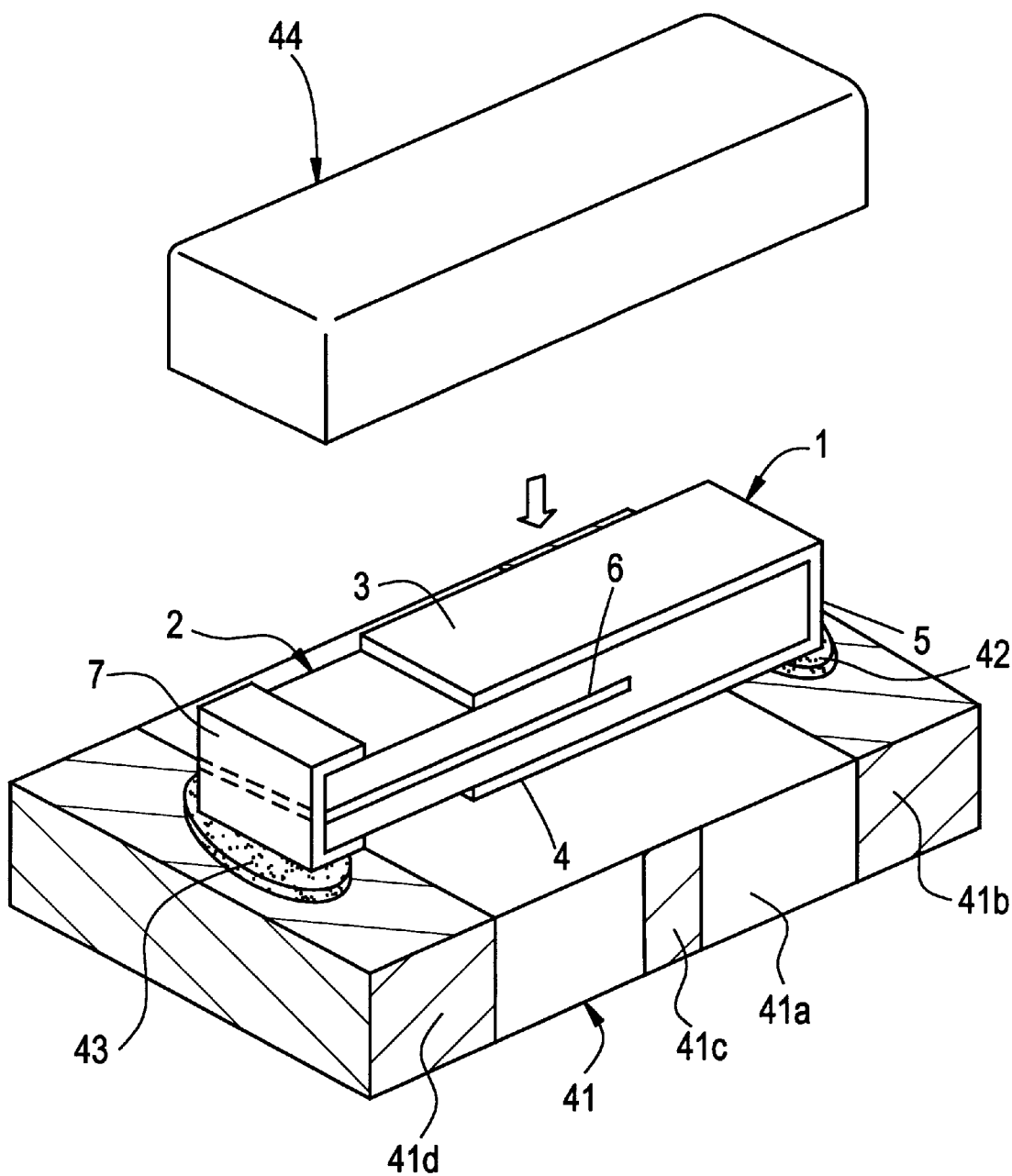
FIG. 7 is an exploded perspective view showing another preferred embodiment of a piezoelectric resonance component in accordance with the present invention.

FIG. 7 is an exploded perspective view for illustrating a piezoelectric resonance component according to a third preferred embodiment of the present invention.

In the piezoelectric resonance component of the third preferred embodiment, the piezoelectric resonator 1 shown in FIG. 7 is disposed on a capacitor substrate 41. The capacitor substrate 41 has a dielectric substrate 41a formed of a dielectric material such as a dielectric ceramic. Electrodes 41b to 41d are provided on the dielectric substrate 41a and are arranged such that the electrodes 41b and 41d reach the upper surface of the dielectric substrate 41a. In the regions where the electrodes 41b and 41d reach to the upper surface of the dielectric substrate 41a, the piezoelectric resonator 1 is joined with conductive adhesives 42 and 43. In other words, terminal electrodes 5 and 7 of the piezoelectric resonator 1 are connected to the electrodes 41b and 41d by the conductive adhesives 42 and 43 and are electrically connected thereto. As a result, the piezoelectric resonator 1 is fixed onto the dielectric substrate 41a so as to define an empty space allows for unhindered vibration of the piezoelectric resonator 1.

The conductive adhesives 42 and 43 are attached such that the adhesives include the parts along the entire length of the lower edges of the end surfaces 2a and 2b of the terminal electrodes 5 and 7. In other words, the lower edges of the end surfaces 2a and 2b are mechanically connected to the capacitor substrate 41, whereby the piezoelectric resonator 1 is supported at both ends in the length direction.

Figure 8:
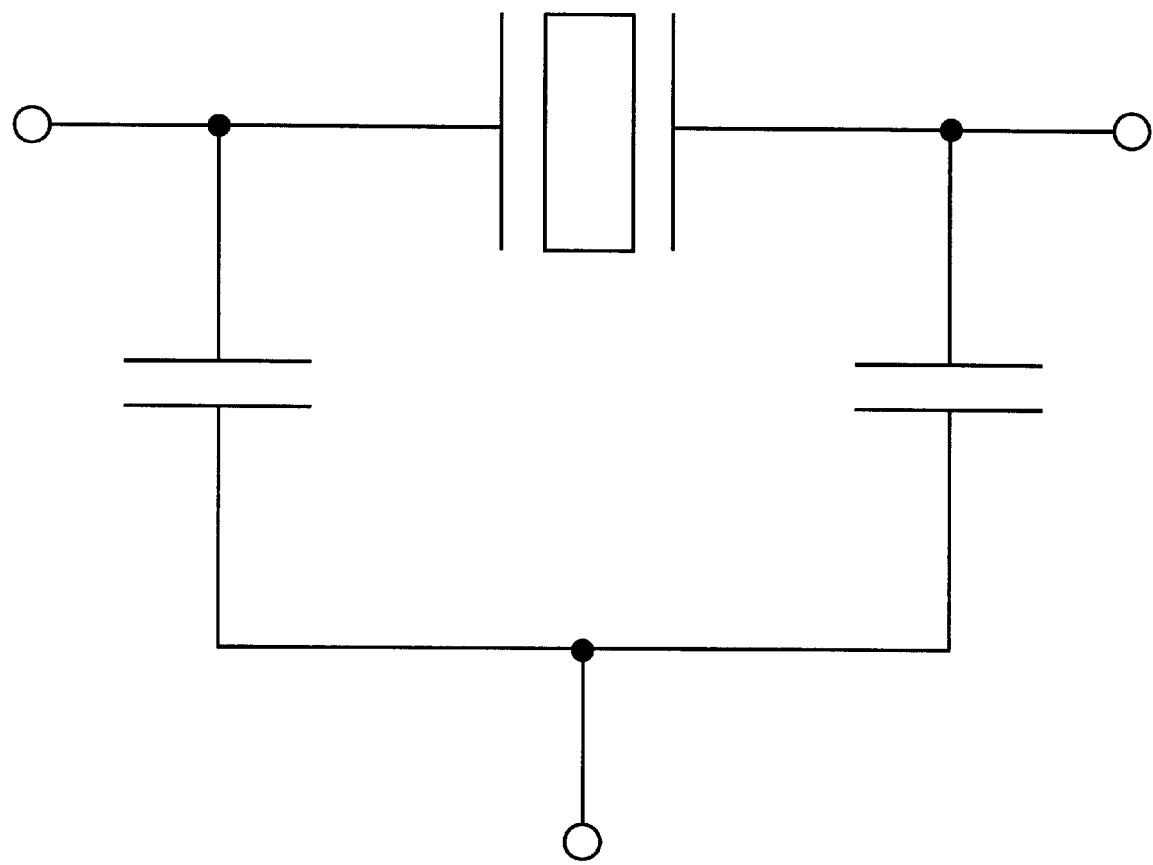
FIG. 8 is a circuit diagram showing a circuit structure of the piezoelectric resonance component shown in FIG. 7.
Figure 9:
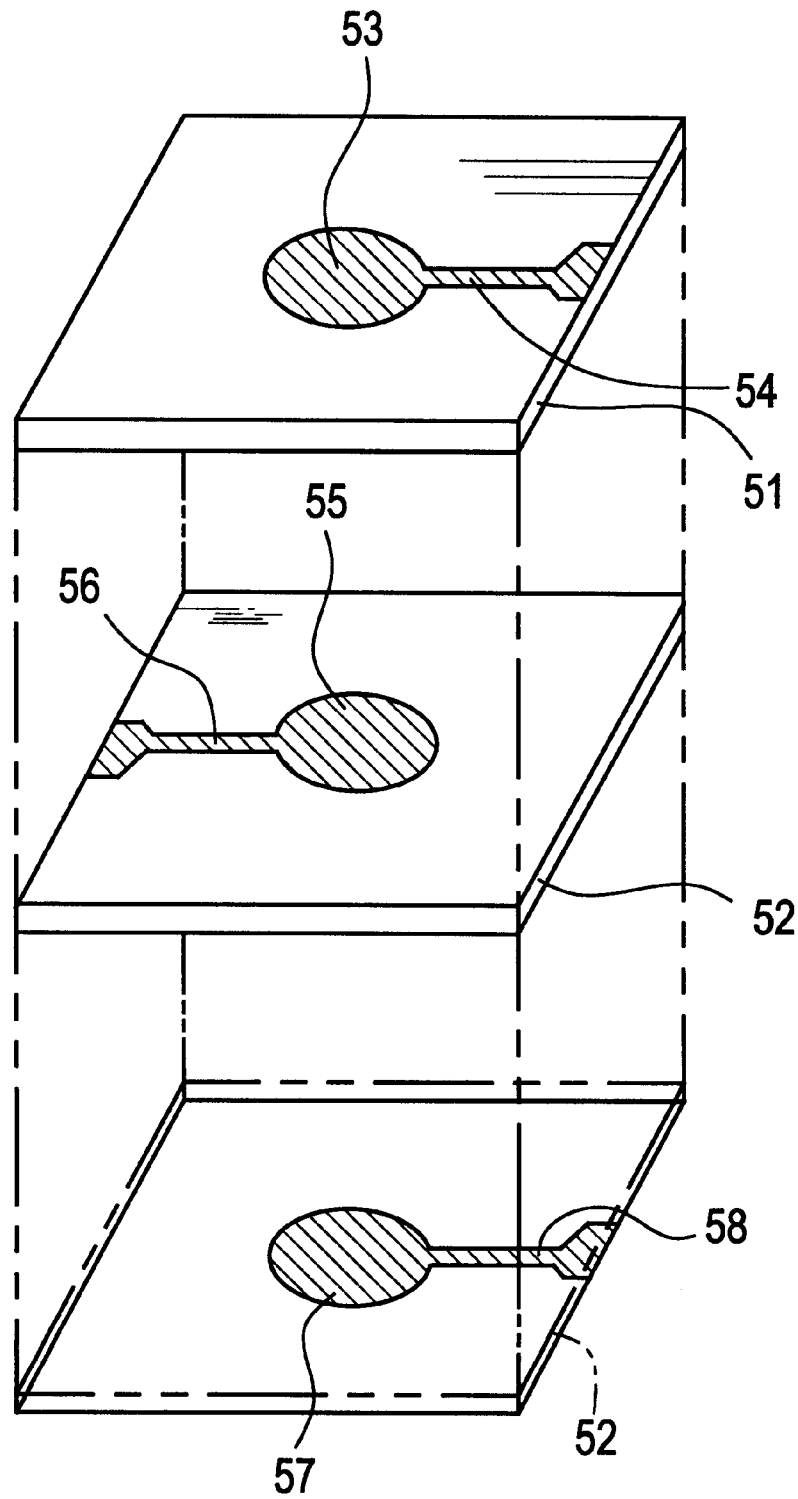
FIG. 9 is an exploded perspective view illustrating an example of conventional thickness-extensional piezoelectric resonators.
Figure 10:
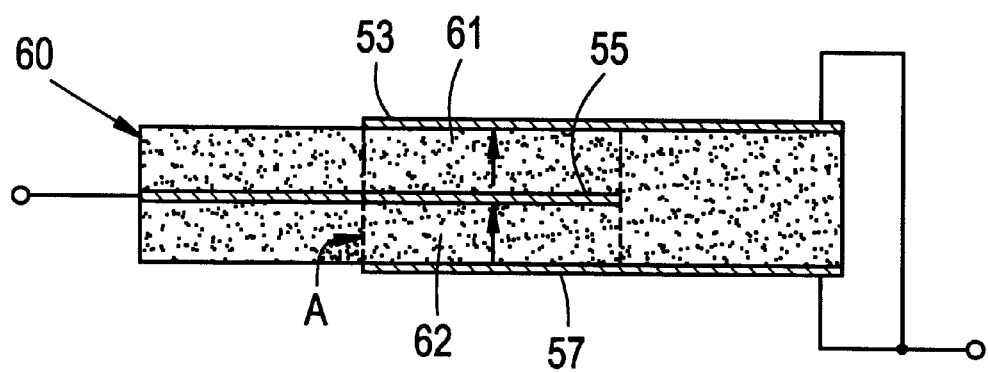
FIG. 10 is a sectional view of the conventional thickness-extensional piezoelectric resonator shown in FIG. 9.
Figure 11:
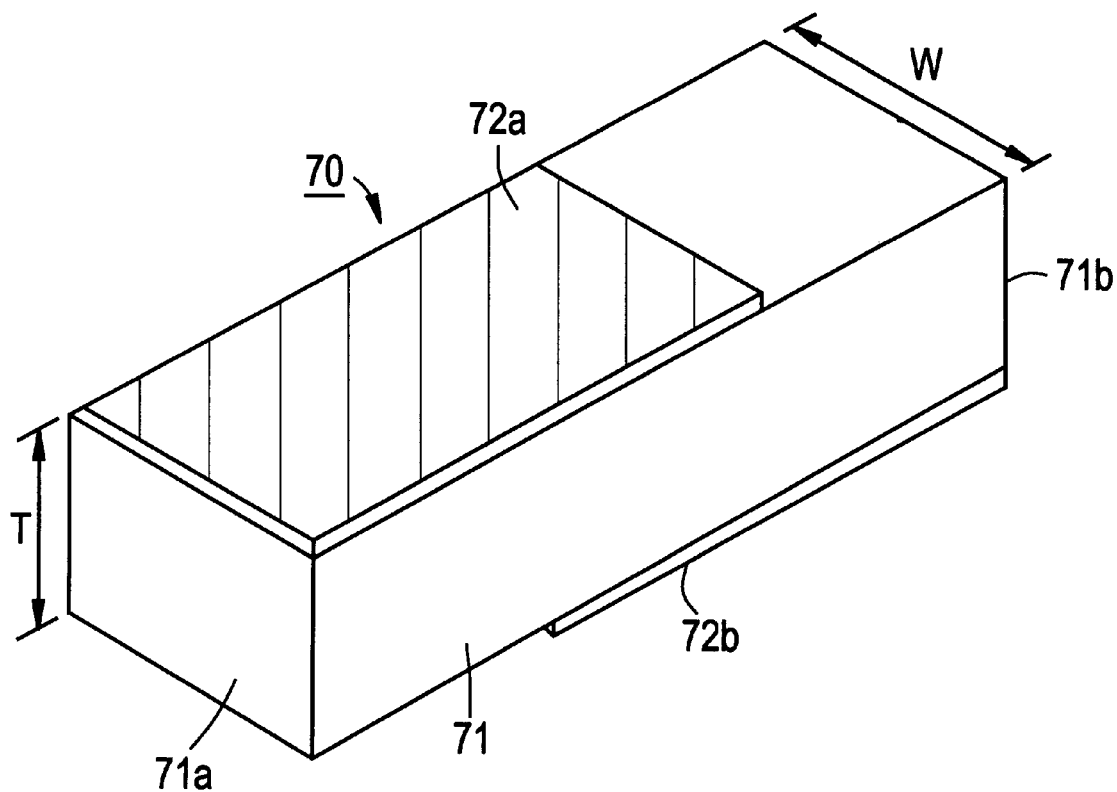
FIG. 11 is a perspective view illustrating another example of conventional thickness-extensional piezoelectric resonators.

On the capacitor substrate 41, capacitors are provided between the electrodes 41b and 41c, and the electrodes 41d and 41c, respectively. As a result, an oscillation circuit is provided between the electrodes 41b to 41d and includes a resonator and two capacitors, as shown in FIG. 8. A cap 44 defining a second case member is joined with an insulating adhesive (not shown), whereby the piezoelectric resonator 1 is enclosed by the case defined by the first and second case members.

Regarding the piezoelectric resonance component of this preferred embodiment, surface mounting on a printed circuit board by using the electrodes 41b to 41d can be conducted. Furthermore, it is possible to use case members having structures different from those of the capacitor substrate 41 and the cap 44 shown in FIG. 7. For example, with regard to the substrate, it is possible to use a container that opens upwardly. The piezoelectric resonator 1 is disposed in the container, and the opening thereof is closed by a plate member functioning as a case member to define a piezoelectric resonator component.

As described above, the present invention can provide a thickness-extensional piezoelectric resonator including a substantially rectangular-plate piezoelectric body, a first excitation electrode and a second excitation electrode provided on outer surfaces of the piezoelectric body, at least one internal electrode disposed inside the piezoelectric body, the at least one internal electrode being at least partially opposed to the first and second excitation electrodes. Thus, when compared with a conventional thickness-extensional piezoelectric resonator having no internal electrodes, the electric capacity is greatly increased. This arrangement greatly reduced and substantially eliminates negative influence due to the stray capacitance of a circuit board, with the result that a piezoelectric resonator with having excellent resonance characteristics can be produced.

At the same time, a vibration-attenuating portion is preferably disposed only in one direction. No vibration-attenuating portions are disposed on either sides of the vibrating portion In a direction perpendicular to the one direction. As a result, since the size of the piezoelectric resonator can be reduced in the direction in which no vibration-attenuating portions are disposed, a compact piezoelectric resonator is produced.

Furthermore, as described above, since the relationship |Dr−Di|=Di/10 is satisfied in this piezoelectric resonator, variations in the resonance characteristics are effectively reduced. Therefore, when the thickness-extensional piezoelectric resonator of preferred embodiments of the present invention is produced in quantity, even if the position of the internal electrode varies, as long as the value of |Dr−Di| is set to be within the above specified range, a piezoelectric resonator having excellent resonance characteristics can be produced.

The use of a narrow strip piezoelectric body permits the dimension of the width direction to be reduced. Thus, the thickness-extensional piezoelectric resonator can be made even smaller.

In addition, in the piezoelectric resonance component in accordance with preferred embodiments of the present invention, the thickness-extensional piezoelectric resonator of the invention is preferably housed in a case defined by a substrate member and a case member. The piezoelectric resonance component of preferred embodiments of the present invention can thus be surface-mounted on a printed circuit board or the like. It is also possible, however, to use an electronic component with a lead by linking a lead terminal to one of the substrate and case members.

Finally, in the piezoelectric resonance component of preferred embodiments of the present invention, when a capacitor substrate is used as the substrate member, and the thickness-extensional piezoelectric resonator is electrically connected to the capacitors provided on the capacitor substrate, it is possible to form a capacity-contained-type piezoelectric oscillator defined by a single integral unit.

It will be apparent from the foregoing that, while the invention has been described in detail and illustrated, there are only particular illustrations and examples and the invention is not limited to these, the spirit and scope of the invention is limited only by the appended claims.

What is claimed is:

1. A piezoelectric resonator comprising:
    a piezoelectric body;
    a first excitation electrode disposed on a first outer surface of said piezoelectric body, said first excitation electrode having a width that is substantially equal to the width of said piezoelectric body;
    a second excitation electrode disposed on a second outer surface of said piezoelectric body, said second excitation electrode having a width that is substantially equal to the width of said piezoelectric body, wherein said second excitation electrode opposes said first excitation electrode with said piezoelectric body therebetween;
    at least one internal electrode disposed inside of the piezoelectric body such that the at least one internal electrode at least partially opposes both the first excitation electrode and the second excitation electrode;
    a resonating portion defined by an area of overlap between the first excitation electrode, the second excitation electrode, and the internal electrode; and
    a plurality of vibration-attenuating portions disposed at opposing sides of the resonating portion and vibrating in N order harmonics of a thickness extensional vibration mode;
    wherein the equation of |Dr−Di|=Di/10 is satisfied, wherein Dr represents the distance between the first excitation electrode and the internal electrode and the value Di is substantially equal to T/N, wherein T is the thickness of the piezoelectric body and N is the order of harmonic vibrations of the thickness-extensional vibration mode.

2. The piezoelectric resonator according to claim 1, wherein said piezoelectric body further comprises a plurality of piezoelectric layers, and wherein said first excitation electrode, said second excitation electrode, and said at least one internal electrode are separated by said plurality of piezoelectric layers.

3. The piezoelectric resonator according to claim 1, wherein the widths of said plurality of vibration attenuation portions are substantially equal to said width of said piezoelectric body.

4. The piezoelectric resonator according to claim 1, wherein said plurality of vibration attenuation portions consist of only two vibration portions.

5. The piezoelectric resonator according to claim 1, wherein a distance between the first excitation electrode and the internal electrode is substantially equal to a distance between the second excitation electrode and the internal electrode.

6. The piezoelectric resonator according to claim 1, wherein said piezoelectric body includes a substantially rectangular strip piezoelectric member.

7. The piezoelectric resonator according to claim 1, wherein said first excitation electrode is electrically connected with said second excitation electrode.

8. The piezoelectric resonator according to claim 1, wherein the piezoelectric resonator is arranged to utilize the second-order harmonic of the thickness-extensional vibration mode.

9. The piezoelectric resonator according to claim 1, wherein the piezoelectric resonator is arranged to utilize the third-order harmonic of the thickness-extensional vibration mode.

10. The piezoelectric resonator according to claim 1, wherein the piezoelectric resonator is arranged to utilize the fourth-order harmonic of the thickness-extensional vibration mode.

11. A piezoelectric resonator comprising:
- a piezoelectric body having a plurality of piezoelectric layers;
- a first excitation electrode disposed on a first outer surface of said piezoelectric body;
- a second excitation electrode disposed on a second outer surface of said piezoelectric body, said second excitation electrode opposes said first excitation electrode with said piezoelectric body therebetween;
- a plurality of internal electrodes disposed inside of the piezoelectric body such that said plurality of internal electrodes at least partially oppose both the first excitation electrode and the second excitation electrode;
- a resonating portion defined by an area of overlap between the first excitation electrode, the second excitation electrode, and the plurality of internal electrodes; and
- a plurality of vibration-attenuating portions disposed at opposing sides of the resonating portion and vibrating in N-order harmonics of a thickness extensional vibration mode;
- wherein the equation of $|Dr-Di|=Di/10$ is satisfied, wherein Dr represents the distance between the first excitation electrode and the internal electrode and the value Di is substantially equal to T/N, wherein T is the thickness of the piezoelectric body and N is the order of harmonic vibrations of the thickness extensional vibration mode.

12. The piezoelectric resonator according to claim 11, wherein at least one of said plurality of internal electrodes is electrically connected to said first excitation electrode, and wherein another of said plurality of internal electrodes is electrically connected to said second excitation electrode.

13. The piezoelectric resonator according to claim 11, wherein none of said plurality of internal electrodes is electrically connected to said first excitation electrode, said second excitation electrode, or another of said plurality of internal electrodes.

14. The piezoelectric resonator according to claim 11, wherein said plurality of internal electrodes are separated from each other via said plurality of piezoelectric layers.

15. The piezoelectric resonator according to claim 11, wherein the piezoelectric resonator is arranged to utilize the second-order harmonic of the thickness-extensional vibration mode.

16. The piezoelectric resonator according to claim 11, wherein the piezoelectric resonator is arranged to utilize the third-order harmonic of the thickness-extensional vibration mode.

17. The piezoelectric resonator according to claim 11, wherein the piezoelectric resonator is arranged to utilize the fourth-order harmonic of the thickness-extensional vibration mode.

18. A piezoelectric resonance component comprising:
- a substrate;
- a piezoelectric resonator mounted on said substrate, wherein said resonator includes:
  - a piezoelectric body;
  - a first excitation electrode disposed on a first outer surface of said piezoelectric body, said first excitation electrode having a width that is substantially equal to the width of said piezoelectric body;
  - a second excitation electrode disposed on a second outer surface of said piezoelectric body, said second excitation electrode having a width that is substantially equal to the width of said piezoelectric body, wherein said second excitation electrode opposes said first excitation electrode with said piezoelectric body therebetween;
  - at least one internal electrode disposed inside of the piezoelectric body such that the internal electrode at least partially opposes both the first excitation electrode and the second excitation electrode;
  - a resonating portion defined by an area of overlap between the first excitation electrode, the second excitation electrode, and the at least one internal electrode; and
  - a plurality of vibration-attenuating portions disposed at opposing sides of the resonating portion and vibrating in N-order harmonics of a thickness extensional vibration mode;
- wherein said substrate is arranged to allow for substantially unhindered vibration of said resonator, and wherein the equation $|Dr-Di|=Di/10$ is satisfied, wherein Dr represents the distance between the first excitation electrode and the internal electrode and the value Di is substantially equal to T/N, wherein T is the thickness of the piezoelectric body and N is the order of harmonic vibrations of the thickness extensional vibration mode.

19. The piezoelectric resonance component according to claim 18, further comprising a case member, said case member being mounted on said substrate so as to completely enclose said resonator.

20. The piezoelectric resonance component according to claim 18, wherein said substrate further comprises a plurality of dielectric capacitors and a plurality of electrodes connected to said capacitors.

* * * * *